United States Patent [19]
Chapman et al.

[11] Patent Number: 6,050,481
[45] Date of Patent: *Apr. 18, 2000

[54] METHOD OF MAKING A HIGH MELTING POINT SOLDER BALL COATED WITH A LOW MELTING POINT SOLDER

[75] Inventors: Brian D. Chapman, Poughkeepsie; James J. Petrone, Hyde Park; Wai Mon Ma, Poughkeepsie, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/882,459

[22] Filed: Jun. 25, 1997

[51] Int. Cl.⁷ .......................... B23K 35/12; B23K 31/02; B05D 5/12
[52] U.S. Cl. .................. 228/254; 228/180.22; 427/96
[58] Field of Search .................. 228/248.1, 254, 228/180.22; 427/96, 123

[56] References Cited

U.S. PATENT DOCUMENTS

| | | | |
|---|---|---|---|
| 4,795,554 | 1/1989 | Bernardi | 209/546 |
| 5,118,027 | 6/1992 | Braun et al. | 228/180.2 |
| 5,147,084 | 9/1992 | Behun et al. | 228/56.3 |
| 5,154,341 | 10/1992 | Melton et al. | 228/180 |
| 5,282,565 | 2/1994 | Melton | 228/180 |
| 5,409,157 | 4/1995 | Nagesh et al. | 228/180 |
| 5,480,835 | 1/1996 | Carney et al. | 437/189 |
| 5,529,957 | 6/1996 | Chan | 437/250 |
| 5,542,174 | 8/1996 | Chiu | 29/840 |
| 5,586,715 | 12/1996 | Schwiebert et al. | 228/248.1 |
| 5,634,268 | 6/1997 | Dalal et al. | 29/840 |
| 5,718,361 | 2/1998 | Dalal et al. | 29/840 |
| 5,729,896 | 3/1998 | Dalal et al. | 29/840 |

*Primary Examiner*—Patrick Ryan
*Assistant Examiner*—Kiley Stoner
*Attorney, Agent, or Firm*—Tiffany L. Townsend

[57] ABSTRACT

A method of forming a solder ball structure comprising the steps of 1) obtaining a first object having at least one high melting point solder ball, each solder ball having a corresponding BLM containing a low melting point solder, each solder ball having an outer surface, top and bottom, each BLM having a top and bottom, the bottom of each solder ball in contact with the top of the corresponding BLM over a portion of the outer surface, the bottom of each BLM in electrical communication with the first object; 2) obtaining a template having a first surface; 3) applying a disjoint area of low melting point solder paste to the first surface of the template; 4) interacting the top of each solder ball and the solder paste; and 5) reflowing each solder ball and disjoint area of solder paste while each solder ball and disjoint area of solder paste are interacted.

22 Claims, 8 Drawing Sheets

METHOD OF MAKING A HIGH MELTING POINT SOLDER BALL COATED WITH A LOW MELTING POINT SOLDER

RELATED APPLICATIONS

This invention is related to copending U.S patent application Ser. No. 08/822,461 entitled "High Melting Point Solder Ball coated with a Low Melting Point Solder," and copending U.S. patent application Ser. No. 08/882,458, entitled "Method for Establishing Electrical Communication between a First Object having a Solder Ball and a Second Object," both assigned to the present assignee and filed on the same day. Each of the above identified applications is incorporated by reference in its entirety.

FIELD OF THE INVENTION

This invention is related to the field of semiconductor packaging. More specifically, the invention relates to a method for creating solder balls that provide a reliable electrical and mechanical connection between a first object containing solder ball structures and a second object.

BACKGROUND OF THE INVENTION

The industry has moved away form the use of pins as connectors for electronic packaging where the pins have a high cost of fabrication, unacceptable percentage of failed connections which require rework, limitations on I/O density and have the electrical limitations of the relatively high resistance connectors. Solder balls are superior to pins in all of the above features as well as being surface mountable, which has obvious implications given the increasingly small dimensions in the forefront technologies today.

Solder mounting is hardly a new technology, itself. But, the need remains to improve the solder systems and configurations in electronic structures. The use of solder ball connectors has been applied to the mounting of integrated circuit chips using the C-4 (controlled collapse chip connection) technology since the method and structure were first described and patented in U.S. Pat. Nos. 3,401,126 and 3,429,040 to Miller et al., which are assigned to the present assignee. A myriad of solder structures have since been proposed for the mounting of IC chips, as well as for interconnection of other levels of circuitry and associated electronic packaging.

Surface mount technology has gained acceptance as the preferred means of joining electronic devices together, particularly in high-end computers. As compared to more traditional pin connector methods, where a pin mounted to the backside of a ceramic module is thrust through a hole in the board, twice the number of modules can be placed at the same board area. Other advantages such as smaller component sizes, greater I/O densities, lower electrical resistance, decreased costs, and shorter signal paths have prompted the industry migration to surface mount technology.

A myriad of solder structures have been proposed for the surface mounting of one electronic structure to another. Typical surface mount processes form the solder structures by screening solder paste on conductive, generally metallic, pads disposed on a surface of a first electronic structure, or "substrate". A stencil printing operation is used to align the contact mask to the pads. The solder paste areas on the substrate are aligned to and placed on corresponding pads on a second electronic structure, or "board". In some processes, solder paste may alternatively or additionally be screened on the board pads. After placement, the substrate and board go through a reflow operation to melt the solder paste and create a solder bond between the corresponding pads on substrate and board.

Other known surface mount technologies use solder balls rather than a solder paste to provide the solder structures. By using solder balls, a more exact and somewhat greater quantity of solder can be applied than through screening. The solder balls are aligned and are held to the substrate and melted to form the solder joint on the conductive pads. As before, the substrate with the newly joined solder balls is aligned to the board. The solder balls are then reflowed to form a good solder bond between substrate and board.

However, both the solder paste and solder ball surface mount techniques suffer when the density of the pads increase. A certain quantity of solder must be maintained to assure a reliable solder joint. As the required quantity of solder becomes large relative to the pad spacing, solder bridging between non corresponding conductive pads becomes a problem. The bridging problem is accentuated by the greater solder amount which is molten during the reflow process.

However, the manufacture of a solder joint using both solder paste and solder balls has proven difficult. Solder balls are difficult to align and handle during the reflow process. Different methods using vibration, brushing and vacuum in association with an alignment plate have been proposed for dealing with solder balls alone. The addition of the solder paste further complicates the process. Many problems were encountered maintaining the solder ball centrality with respect to each other and on the substrate, even to the extend that the solder balls were missing entirely. With the misalignment of the solder balls, bridging between adjacent pad sites become a problem. Good physical contact between the solder balls, solder paste and substrate must be assured while simultaneously preserving the alignment between substrate pads and solder joints. Process time mushroomed as the number of process checks increased.

One module that can be manufactured with a combination solder ball/solder paste connection is a ceramic ball grid array (CBGA). CBGA modules are preferred in some situations because a higher density of I/Os can be packaged per unit area as compared with perimeter leaded components. Additionally, CBGAs offer other advantages. CBGAs are less susceptible to damage while handling and there tends to less induction noise than pin-in-hole devices.

However, there are some potential drawbacks to using CBGAs. The solder joints are under the CBGAs. Any repairs necessitate the complete removal of the CBGA module. It is difficult to inspect the I/O solder joints by conventional means. The repair process can be very time consuming and expensive. To minimize the need for repairs CBGA users can invest in a solder paste volume measurement tool to assure that every pad has the correct amount of solder. The use of such a tool can increase assembly cycle time.

A popular method of attachment currently in use requires that the solder paste be applied to the circuit card. The solder paste volume is then measured. The CBGA module and the circuit card are brought into contact the solder paste is reflowed.

SUMMARY OF THE INVENTION

It is therefore an object of the present invention to provide a solder ball structure that accurately supplies a predetermined amount of solder. It is another object of the invention to provide a high melting point solder ball with an low melting point coating. It is yet another object of the present invention to provide a solder ball structure where a high melting point solder is encapsulated by an low melting point solder coating. It is still another object of the present invention to provide a collapsible solder ball structure with a low melting point coating. It is further an object of the present invention to provide a solder ball structure that supplies specific volumes of solder. It is still yet another object of the present invention to provide a method for marking a solder ball structure that supplies a specific volume of solder. In accordance with the above listed and other objects we disclose and claim a method of forming a solder ball structure comprising the steps of 1) obtaining a first object having at least one high melting point solder ball, each solder ball having a corresponding BLM containing a low melting point solder, each solder ball having an outer surface, top and bottom, each BLM having a top and bottom, the bottom of each solder ball in contact with the top of the corresponding BLM over a portion of the outer surface, the bottom of each BLM in electrical communication with the first object; 2) obtaining a template having a first surface; 3) applying a disjoint area of low melting point solder paste to the first surface of the template; 4) interacting the top of each solder ball and the solder paste; and 5) reflowing each solder ball and disjoint area of solder paste while each solder ball and disjoint area of solder paste are interacted.

BRIEF DESCRIPTION OF THE DRAWING

These and other features, aspects, and advantages will be more readily apparent and batter understood from the following detailed description of the invention, in which.

DESCRIPTION OF THE PREFERRED EMBODIMENTS

The present invention can be used for connecting solder joints to any parts utilizing surface mount technology. In the packaging area, there are a plethora of electronic structures which require connection to other similar electronic structures or to other levels of package. New and creative connection protocols have necessitated the development of a new and different solder ball structures, including new collapsible solder ball structures.

By solder ball it is meant that a predetermined shape of a admixture of metals has been formed by any means known in the art and at least one reflow of the admixture has occurred. The admixture is typically of lead and tin. The shape of the admixture is left to the discretion of the user. It should be noted that according to the method and structure of the present invention a solder ball does not have to be spherical. For descriptive purposes only, the multitude of possible geometries will be referred to generally as solder balls.

In the present invention, a high melting point, HMP, solder ball is encapsulated by a low melting point, LMP, solder. The terms low melting point, LMP, and high melting point, HMP, are not terms having specific temperatures associated with them. Examples of materials which are suitable include a eutectic solder of 37/63 weight percent Pb/Sn for the LMP material and a non-eutectic solder composition of 90/10 weight percent Pb/Sn for the HMP material. There are a wide range of materials which would be suitable for the subject invention, many of which are recited throughout the art with reference to solder connections.

Figure 1:
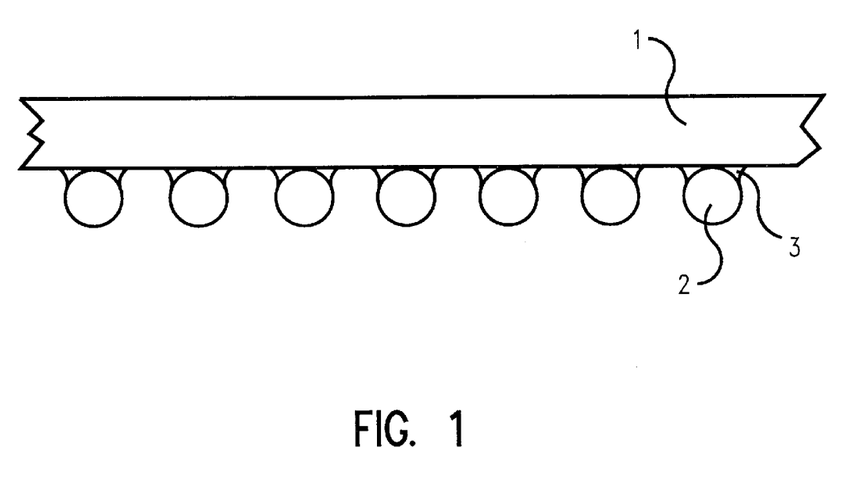
FIG. 1 is a cross sectional view of a substrate with a solder ball and BLM attached.

Referring to the figures in general and FIG. 1 in particular, a method of making the present invention is shown. As shown in FIG. 1, the bottom of a solder ball, 2, is in contact with a BLM, 3, containing a LMP solder (LMP BLM). By BLM it is meant a ball limiting metallurgy structure. The BLM facilitates the electrical and physical connection of the admixture of solder with the first object. The BLM can be an integral part of the first object or formed on the first object. For the purposes of this invention, the BLM can be formed by any means known in the art as long as the necessary electrical and/or physical connection between the first object and the admixture of solder exists. It is necessary that at least a portion of the BLM comprise a LMP solder. The BLM, 3, may contain other components necessary to ensure proper electrical communication between the first object, 1, and the solder ball, 2. The BLM, 3, is in electrical communication with a first object, 1. The BLM can be formed and/or deposited by any means known in the art such that it can function with the first object. The first object, 1, is usually a substrate but the method and structure of the present invention are not limited by the composition of the first object, 1. For descriptive purposes only, the first object, 1, will hereafter be referred to as a substrate.

Figure 2:
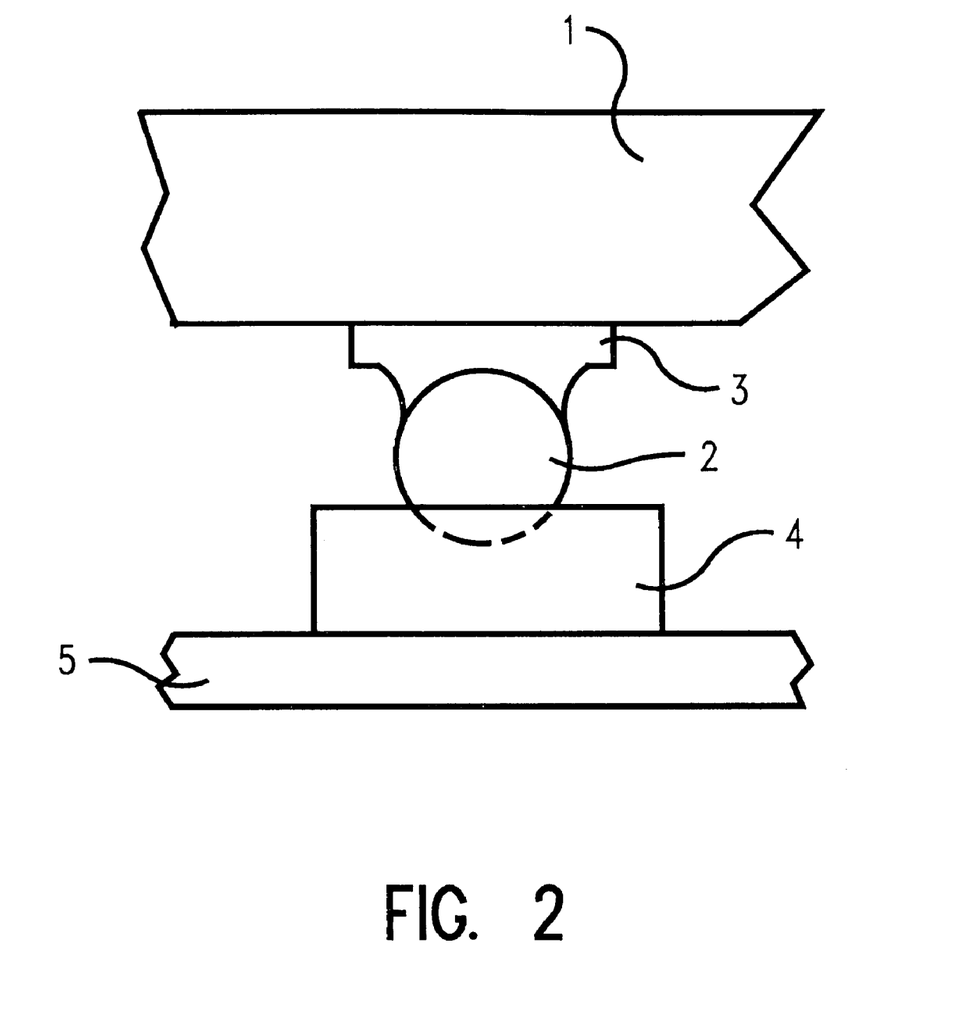
FIG. 2 is a cross sectional view of the contacting step of the method of the present invention.

As shown in FIG. 2, the substrate, 1, containing the LMP BLM, 3, and HMP solder ball, 2, is brought into contact with a disjoint area of solder paste, 4, on a second object, 5. The shape of the disjoint area of LMP solder paste, 4, is determined by the user. A requirement of the subject invention is that the reflow of the LMP BLM and LMP solder paste occur without a significant portion of the HMP solder ball melting. A reflowing is accomplished while the solder ball 2 is in contact with the solder paste, 4. The reflowing can be accomplished by any means known in the art. The reflowing should occur at a temperature that is high enough to melt the LMP solder paste, 4, and the LMP solder BLM, 3, without melting a significant portion of the HMP solder ball, 2.

A reflow will give the final form of the structure of one embodiment of the present invention (See FIG. 2b) where the HMP solder ball is essentially encapsulated in the LMP solder. The reflowing will take place at a temperature that will cause only the LMP solder in the BLM and the LMP solder paste to melt without a significant portion of the HMP solder ball melting.

Figure 2A:
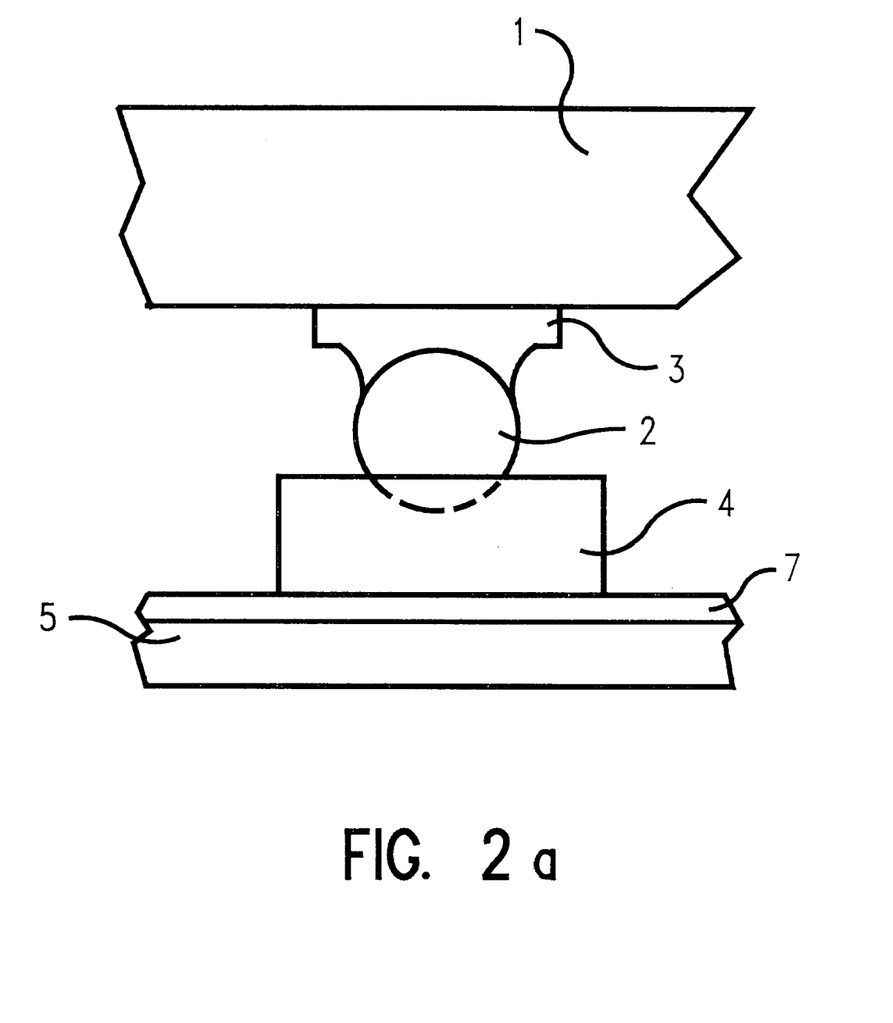
FIG. 2a is a cross sectional view of a preferred embodiment of the contacting step of the method of the present invention.
Figure 2B:
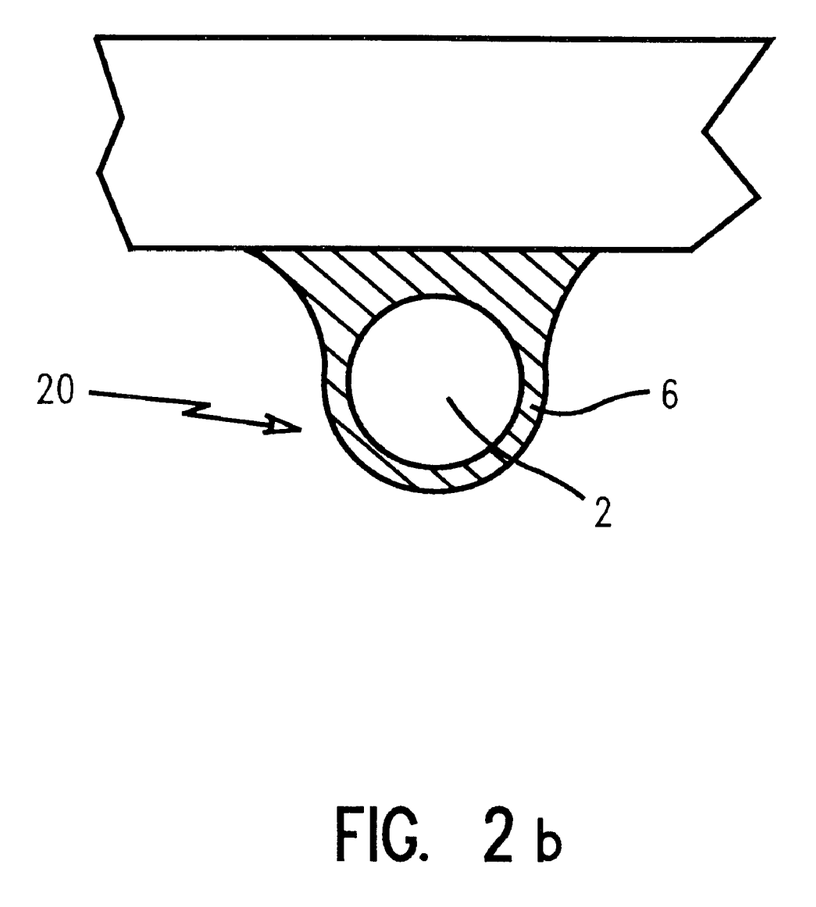
FIG. 2b is a cross sectional view of an individual coated solder ball structure of an embodiment of the present invention.

In a preferred embodiment, the solder ball diameter is 32 to 36.5 mils. In a more preferred embodiment the BLM and the solder paste would be a eutectic solder. In a preferred embodiment, the reflowed solder will be one homogeneous unit once it cools.

In a preferred embodiment, the solder paste volume equals $$\left(\frac{\pi*(D^3-d^3)}{6}\right)*2$$

Where D=diameter of the solder ball plus the desired coating thickness, and d=diameter of the solder ball and the solder paste would be stencilled on the second object. The solder paste volume then would be measured. Also, in a more preferred embodiment the volume of the solder paste would be at least about 8689 and at most about 11200 cubic mils and the solder paste volume would be measured using a laser tool. The height and diameter of the disjoint area of solder paste would also be controlled by the user. The diameter of the disjoint area of solder paste would be at least about 30 and at most about 34.5 mils. The height of the disjoint area of solder paste would be at least about 9 and at most about 16 mils. In a most preferred embodiment, the solder paste volume would be about 11,000 cubic mils, the diameter would be about 34 mils and the height would be about 12 mils and the solder paste would be measured using a Cybersentry™ laser tool.

In a preferred embodiment, the second object, 5, would be a plate comprising high temperature glass or aluminum. In a more preferred embodiment the plate would be thin and flat. In an even more preferred embodiment, see FIG. 2a, the plate, 5, would be coated with a non-wettable film, 7, that is heat resistant up to at least about 260° C.

Examples of films, 7, include a polyimide tape like Kapton™ or a fluorocarbon copolymer like Teflon™. In a most preferred embodiment the second object would be a thin, flat, high temperature resist, glass plate with a Kapton™ coating.

In a preferred embodiment, the reflowing would be accomplished at a temperature of at least about 200° C. and at most about 205° C. Also in the preferred embodiment, the reflowing would be continued for at least about 20 seconds and at most about 30 seconds.

FIG. 2b shows a final structure of the more preferred embodiment, 20, after the reflowing, where the BLM and the solder paste are both eutectic. The HMP solder ball, 2, is enclosed in the LMP solder ball coating, 6. The coating, 6, is formed from the reflowed BLM and solder paste. The coating, 6, is present over at least the portion of the solder ball surface not in contact with the corresponding BLM. In a preferred embodiment there would be no delineation between the portion of the coating, 6, that was contributed by the LMP solder paste, 4, and portion contributed by the LMP solder containing BLM, 3. In a preferred embodiment the thickness of the coating is 2.5 mils. Also in the preferred embodiment, the HMP solder ball is comprised of 90% tin and 10% lead in admixture.

Figure 3:
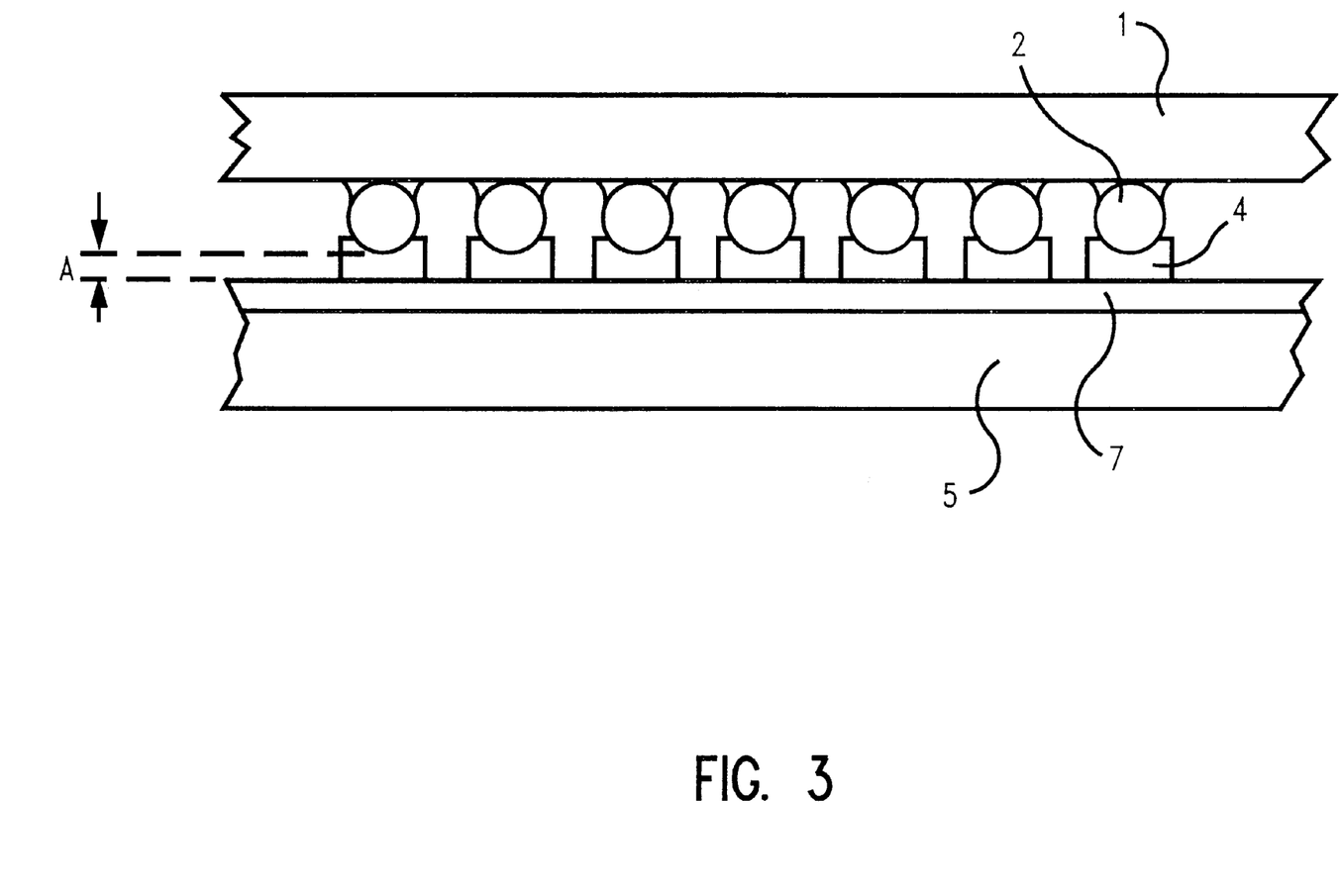
FIG. 3 is a cross sectional view of the contacting step of an alternative method of the current invention.
Figure 4:
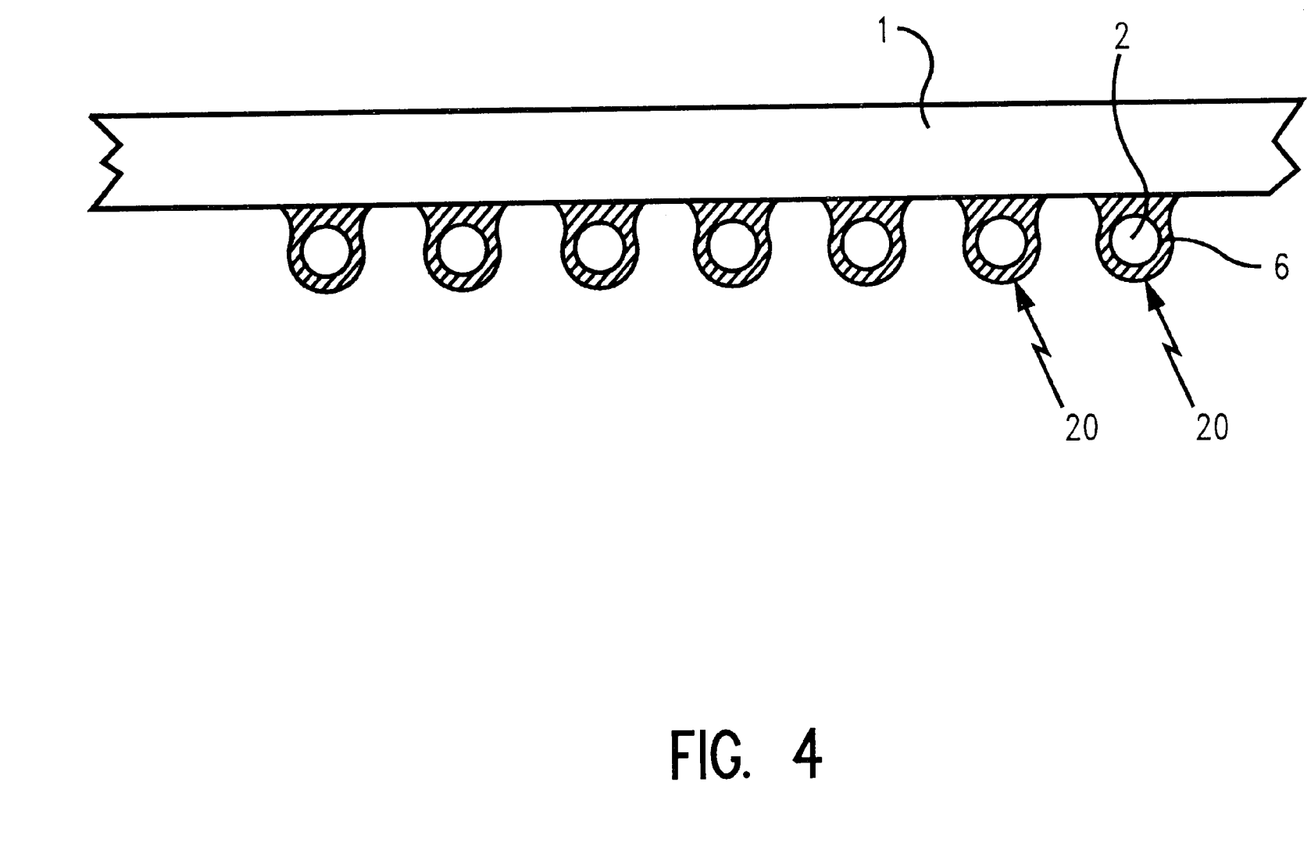
FIG. 4 is a cross sectional view of the a coated solder ball structure of an alternative embodiment of the present invention.

FIG. 3 shows an embodiment of the present invention where a plurality of coated solder ball structures, 20 in FIG. 2b, would be formed at the same time. The individual HMP solder balls, 2, are similar in form to those shown in FIG. 1, where the BLM contains a LMP solder. The HMP solder balls, 2, contact the disjoint areas of LMP solder paste, 4. A reflow is then accomplished while the solder balls, 2, are in contact with the solder paste, 4. The after the reflow the structure as shown in FIG. 4 should exist where a LMP solder coating, 6, encapsulates each HMP solder ball, 2. The coating, 6, is present over at least the portion of the solder ball surface not in contact with the corresponding BLM.

When performing the method identified in FIG. 3 there are a number of factors that can influence the final size and shape of the coated solder ball structure in the alternate embodiment. Some of the factors were introduced in the discussion of the method given above to form the structure of FIG. 2b. The factors include, but are not limited to, the size and composition of the solder ball, the size and shape of the solder paste, the choice of materials for the second object, and the reflow temperature. The parameters previously given for the preferred embodiment described in FIGS. 2, 2a and 2b which pertain to the solder ball, solder paste and the BLM also apply in a corresponding manner in this alternative embodiment.

Figure 3A:
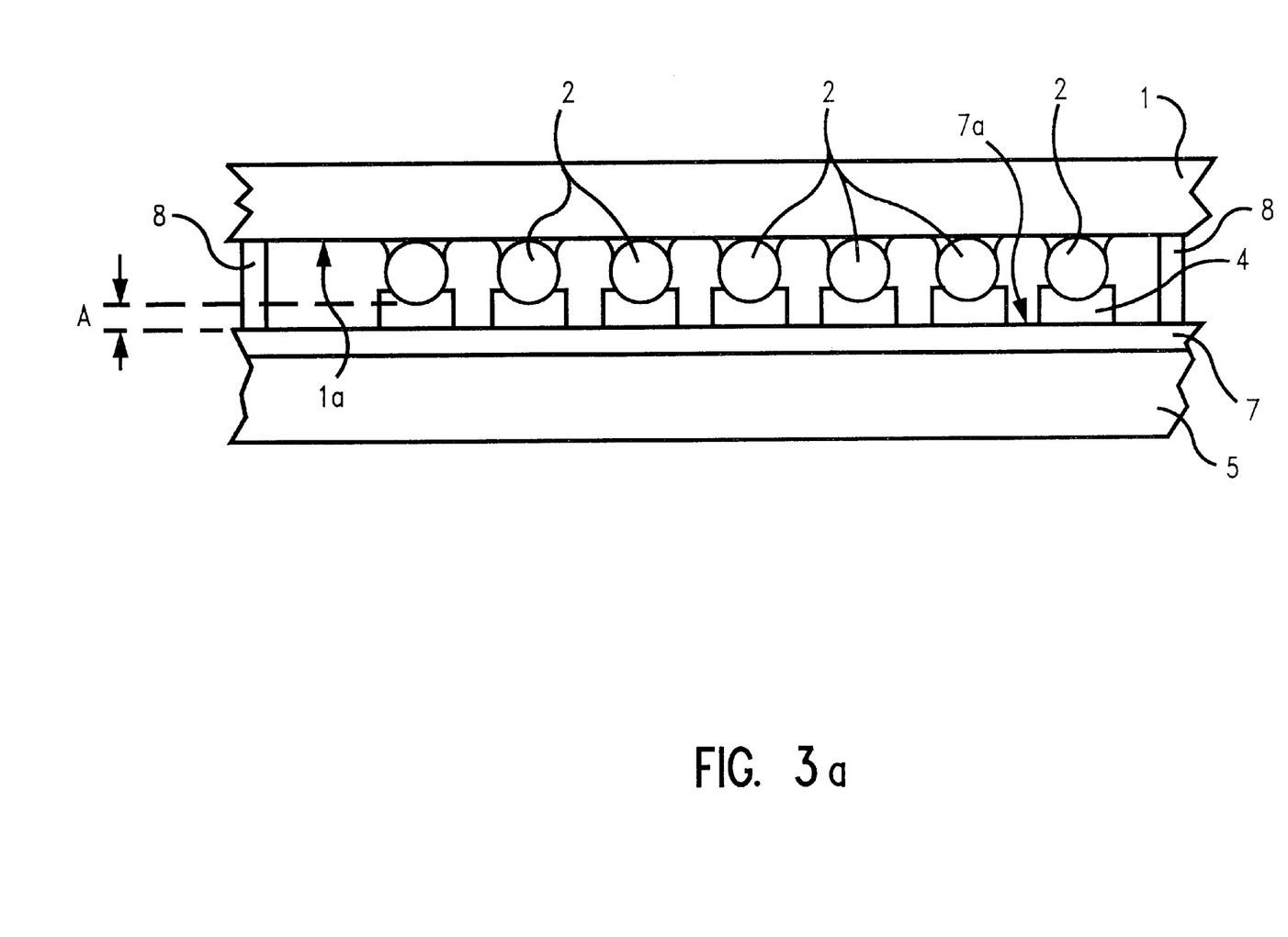
FIG. 3a is a cross sectional view of a preferred embodiment of the contacting step of the method of the present invention.

In a preferred embodiment of the alternative embodiment, there is another factor that can be controlled. When coating solder balls, 2, as shown in FIG. 3a, it can desirable to control the distance between the top of the solder ball and the surface of the second object, A, to achieve a consistent solder ball coating thickness. The shape of the final coated structure can be effected by the distance, A. The distance can be controlled by monitoring the distance, A, directly. An indirect measurement of A can also be achieved by monitoring the distance between the surface of the substrate, 1a, and the surface of the second object, 7a, if the distance between the substrate and the top of the solder ball is known or predictable. The substrate and the second object could be moved toward each other a predetermined distance such that the distance A is then maintained. In a most preferred embodiment the distance, A, is 7 mils.

In a preferred embodiment, standoffs, 8, would be employed to ensure that the distance A was maintained as shown in FIG. 3a. The standoffs may be comprised of any material able to withstand temperatures of at least about 205° C. The standoffs would be located in an area where they would not interfere with the step of contacting the solder balls and the solder paste and could be attached to either the substrate or the second object prior to the contacting. Alternatively, the standoffs could be attached to neither the substrate nor the second object and could be inserted between the substrate and the second object by the same action that brings the substrate and the second object into contact with each other. In a more preferred embodiment, the standoffs would be attached to the second object.

An example of the final structure, 20, that is achieved by the alternative embodiment shown above is shown in FIG. 4. The composition parameters for the HMP solder ball coating, 6, and the HMP solder ball 2, are the same as those for the solder ball shown in FIG. 2b. In a preferred embodiment there would be no delineation between the portion of the coating, 6, that was contributed by the LMP solder paste and portion contributed by the LMP solder containing BLM. In a preferred embodiment the substrate would be a module. In a more preferred embodiment the module would be a ceramic ball grid array.

The structure of the present invention can be used to attach an object having the solder ball structure to a second object. The connection should at least be electrical. The connection could also be physical or mechanical. There are any number of potential applications. A LMP coated HMP solder ball can be used for direct chip attach to a circuit cards. Also, LMP coated micro HMP solder balls can, be used on a chip attached to another substrate such as circuitized ceramic, polyimide, Teflon™ or plastic. The structure of the present invention can also be used in situations where coplanarity of the two objects being connected is a concern. Where one of the two objects to be connected can potentially be warped by more than 2 mils, the connection can be more effective if the solder balls are collapsible, as in the present embodiment.

For example, a circuit card may have more than a 2 mil warpage, for any number of reasons. The warpage may occur during manufacturing or it may be the result of heat fluctuations during a repair process. An embodiment of the structure of the present invention may be used when there is warpage greater than about 2 mils. in the second object. The thickness of the coating on the solder ball can be adjusted depending on the actual or predicted warpage of the second object.

Figure 5:
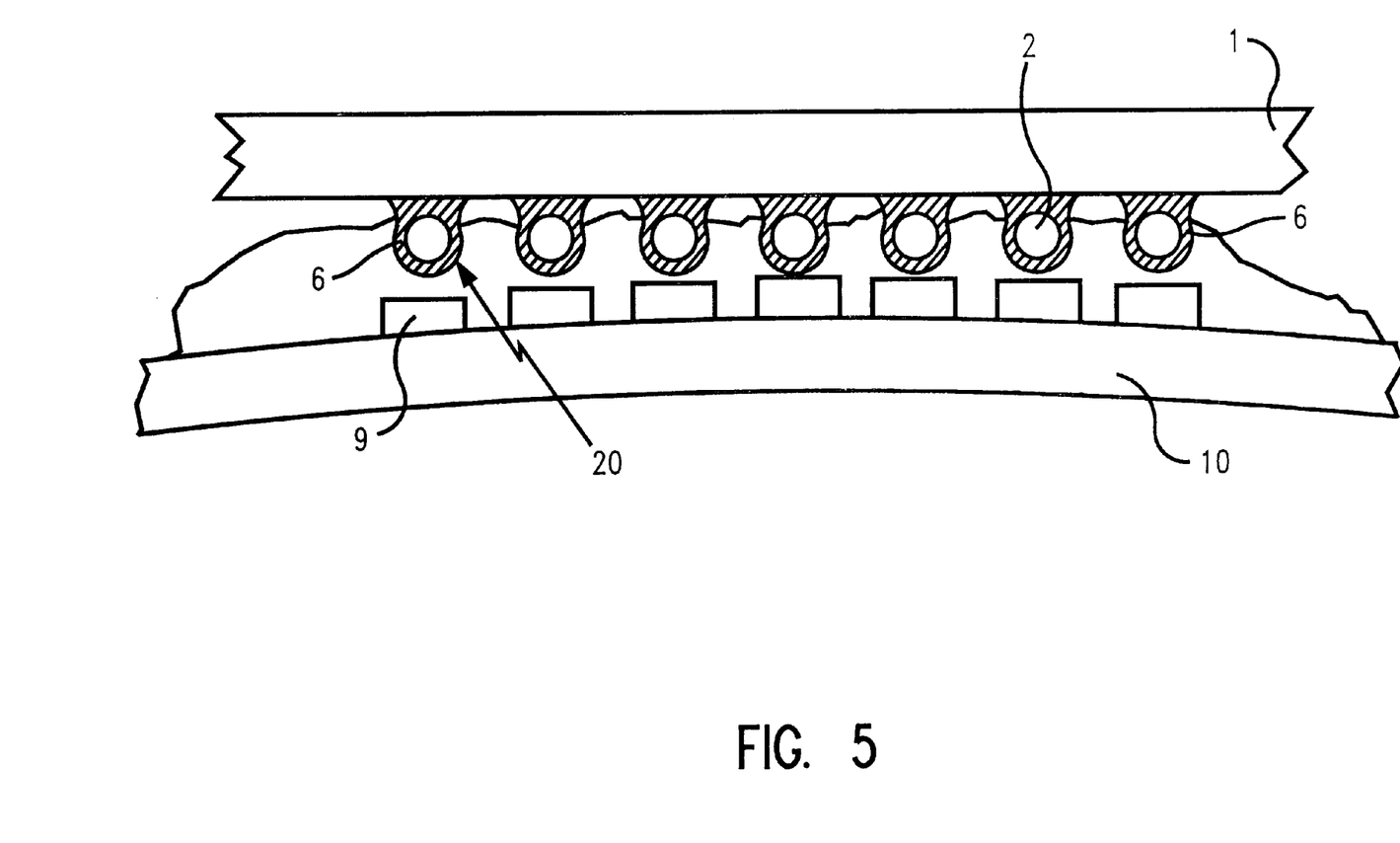
FIG. 5 is a cross sectional view of an implementation of an alternative embodiment of the present invention; all in accordance with the present invention.

FIG. 5 shows an implementation of the structure of FIG. 4. A substrate, 1, with a plurality of distinct coated solder balls, 20, thereon is brought into contact with a second object, 10. It should be noted that the structure of the current invention is still operable if none of the coated solder balls are in contact with the circuit card, as long as they are proximally situated. By proximally situated it is meant that the substrate and the circuit card are no more than a maximum distance from each other. The maximum distance is a function of ball size, pitch between the balls and the coating thickness. The formula is maximum distance (Cd)=

$$\frac{(P - Dmax - 7)}{2}$$

where P=the pitch between the solder balls and Dmax=the maximum diameter of the solder ball. Cd is also equal to the maximum coating thickness. The present invention is operable when the maximum distance between the top of any individual coated solder ball and its corresponding pad is at most about 3.5 mils.

In the current example, shown in FIG. 5, the second object is a circuit card. The circuit card, 10, has a plurality of solder ball attachment points, 9. There is one attachment point, 9, for each solder ball structure, 20, connection desired. In the current example the attachment point, 9, is a copper pad which connects to the circuit card circuitry. It can be seen that due to warpage of the circuit card, 10, at least one of the attachment points, 9, may not be in contact with the corresponding coated solder ball, 20. A reflow is then accomplished. In a preferred embodiment, the reflow is accomplished while at least one of the coated solder balls, 20, is in contact with the corresponding attachment point, 9. In a more preferred embodiment a majority of the coated solder balls, 20, are in contact with the corresponding attachment point. Also, in a preferred embodiment, each attachment point, 9, is coated with a material to facilitate the reflow. In a more preferred embodiment, each attachment point is coated with a water soluble or no-clean flux paste. In a most preferred embodiment, the reflow temperature is at least about 200° C. and at most about 220° C., the coating is 2.5 mils thick and the solder ball has a 35 mil diameter and a majority of the coated solder balls are in contact with the corresponding water soluble flux coated attachment points.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall with the scope and spirit of the invention and the appended claims.

We claim:

1. A method of forming a solder ball structure comprising the steps of:
   a) obtaining a first object having at least one high melting point solder ball, wherein at least one of said high melting point solder ball has a corresponding ball limiting metallurgy structure (BLM) having a top and bottom and containing a low melting point solder, and wherein said solder ball has an outer surface, a top and a bottom and wherein the bottom of said solder ball in contact with the top of the corresponding BLM over a portion of the outer surface and wherein the bottom of said BLM in electrical communication with the first object;
   b) obtaining a template having a first surface;
   c) applying at least one disjoint area of low melting point solder paste to the first surface of the template;
   d) engaging the top of each at least one solder ball and the solder paste; and
   e) reflowing the solder ball and the disjoint area of solder paste while the solder ball and the disjoint area of solder paste are interacted, wherein the high melting point solder ball is coated with the low melting point solder over substantially all of the surface of the high melting point solder ball not in contact with the BLM; and
   f) disengaging the template from the solder ball structure.

2. The method according to claim 1 wherein the template comprises material with a melting point that is substantially higher than the melting point of the solder paste.

3. The method according to claim 2 wherein the material is selected from the group consisting of glass and alumina.

4. The method according to claim 3 wherein the material is glass.

5. The method according to claim 1 further comprising a template coating comprising a non-wettable film that is heat resistant to at least about 260° C., and wherein the coating is in contact with the first surface of the template and wherein the coating lies between the first surface and the solder paste.

6. The method according to claim 5 wherein the template coating is selected from the group consisting of polyimide tapes and fluorocarbon copolymers.

7. The method according to claim 6 wherein the template coating comprises polyimide tapes.

8. The method according claim 1 wherein the applying of the solder paste comprises stencilling the disjoint area of solder paste.

9. The method according to claim 8 wherein the disjoint area is measured prior to the step of contacting the top of the solder ball and the solder paste.

10. The method according to claim 9 wherein the disjoint area is measured using a laser tool.

11. The method according to claim 1 wherein the disjoint area of solder paste has a volume of at least about 8689 and at most about 11,200 cubic mils.

12. The method according to claim 2 wherein the disjoint area of solder paste has a volume of 11000 cubic mils.

13. The method according to claim 1 wherein the height of the disjoint area of paste is at least about 9 and at most about 16 mils.

14. The method according to claim 13 wherein the height of the paste is about 12 mils.

15. The method according to claim 1 wherein the diameter of the paste is at least about 30 and at most about 34.5 mils.

16. The method according to claim 1 wherein the diameter of the paste is 34 mils.

17. The method according to claim 1 wherein the reflowing is accomplished at a temperature of at least about 200 and at most about 205° C.

18. The method according to claim 1 wherein the interacting comprises contacting the solder ball and the solder paste, and wherein the distance from the top of the solder ball to the first surface of the template is a predefined distance.

19. The method according to claim 18 wherein the distance is 7 mils.

20. The method according to claim 18 further comprising at least one standoff situated between the first object and the template and wherein the standoff is capable of ensuring that the distance from the top of the solder ball to the first surface of the template is a predefined distance.

21. The method according to claim 20 wherein the distance is 7 mils.

22. A method of forming a solder ball structure on a ceramic ball grid array comprising the steps of:
   a) obtaining a module having a plurality of solder balls having a top and a bottom, and the module also having a plurality of BLMs having a top and a bottom, wherein the bottom of the BLM is in electrical communication with the module, and wherein the top of the BLM is contacting the bottom of the solder ball, and wherein the BLM comprises 37% Pb and 63% Sn in admixture, the solder balls comprises 90% Pb and 10% Sn in admixture;
   b) obtaining a thin, flat, glass plate having a first side and having a non-wettable film coating comprising a polyimide tape attached to the first side, and wherein the flat plate is operably associated with a plurality of standoffs capable of ensuring that the distance between the flat plate and the top of the solder balls is 7 mils;
   c) stenciling a plurality of disjoint areas of solder paste on the first side of the coated thin, flat glass plate, wherein each of the area corresponds to one solder ball, and wherein the disjoint areas of solder paste have a volume of about 11,000 cubic mils, a height of about 12 mils, and a diameter of about 34 mils,
   d) contacting the module and the flat plate such that the standoffs are abutting the module; and
   e) reflowing to a temperature from about 200 to about 205° C. for at least about 20 seconds and at most about 30 seconds while the module is in contact with the flat plate wherein the high melting point solder ball is coated with the low melting point solder over substantially all of the surface of the high melting point solder ball not in contact with the BLM;
   f) disengaging the contact between the module and the flat plate.

* * * * *